United States Patent
Motz

(10) Patent No.: US 7,098,827 B2
(45) Date of Patent: Aug. 29, 2006

(54) INTEGRATOR CIRCUIT

(75) Inventor: Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/124,436

(22) Filed: May 6, 2005

(65) Prior Publication Data

US 2005/0275575 A1   Dec. 15, 2005

(30) Foreign Application Priority Data

May 7, 2004   (DE) ................ 10 2004 002 572

(51) Int. Cl.
*H03M 3/00*   (2006.01)
(52) U.S. Cl. .................................. 341/143
(58) Field of Classification Search ........... 341/143, 341/144, 156, 155, 176, 131, 166, 172; 375/26, 375/29, 34; 307/490, 491
See application file for complete search history.

(56) References Cited

U.S. PATENT DOCUMENTS

| | | | |
|---|---|---|---|
| 4,939,516 A * | 7/1990 | Early | 341/143 |
| 4,972,141 A | 11/1990 | Rozman et al. | 324/142 |
| 5,039,989 A * | 8/1991 | Welland et al. | 341/143 |
| 5,337,013 A * | 8/1994 | Langer et al. | 324/537 |
| 6,940,438 B1 * | 9/2005 | Koe et al. | 341/143 |

FOREIGN PATENT DOCUMENTS

WO   WO 02/03087 A1   1/2002

OTHER PUBLICATIONS van der Zwan, Eric J., et al., A 0.2-mW CMOS ΣΔ Modulator for Speech Coding with 80 dB Dynamic Range, IEEE Journal of Solid-State Circuits, vol. 31, No. 12, pp. 1873-1880, Dec. 1996.
Qiang, Li, et al., A Novel Offset Compensation Biquad Switched-Capacitor Filter Design, ASIC, vol. 1, pp. 643-646, Oct. 2003.

* cited by examiner

*Primary Examiner*—Brian Young
(74) *Attorney, Agent, or Firm*—Baker Botts L.L.P.

(57) ABSTRACT

An integrator circuit has an integrator unit performed to generate an integrated signal from a modulated input signal. Additionally, the integrator circuit has an error feedback coupler connected to an output of the integrator unit and to an input of the integrator unit and formed to determine an error component from the integrated signal or from a signal derived from the integrated signal and to compensate the error component via the feedback in the modulated input signal.

26 Claims, 7 Drawing Sheets

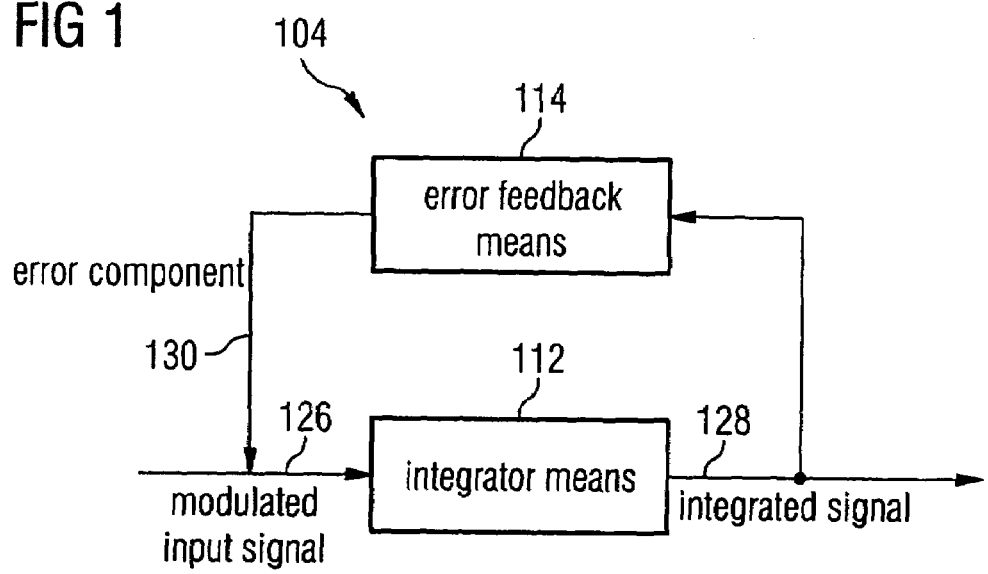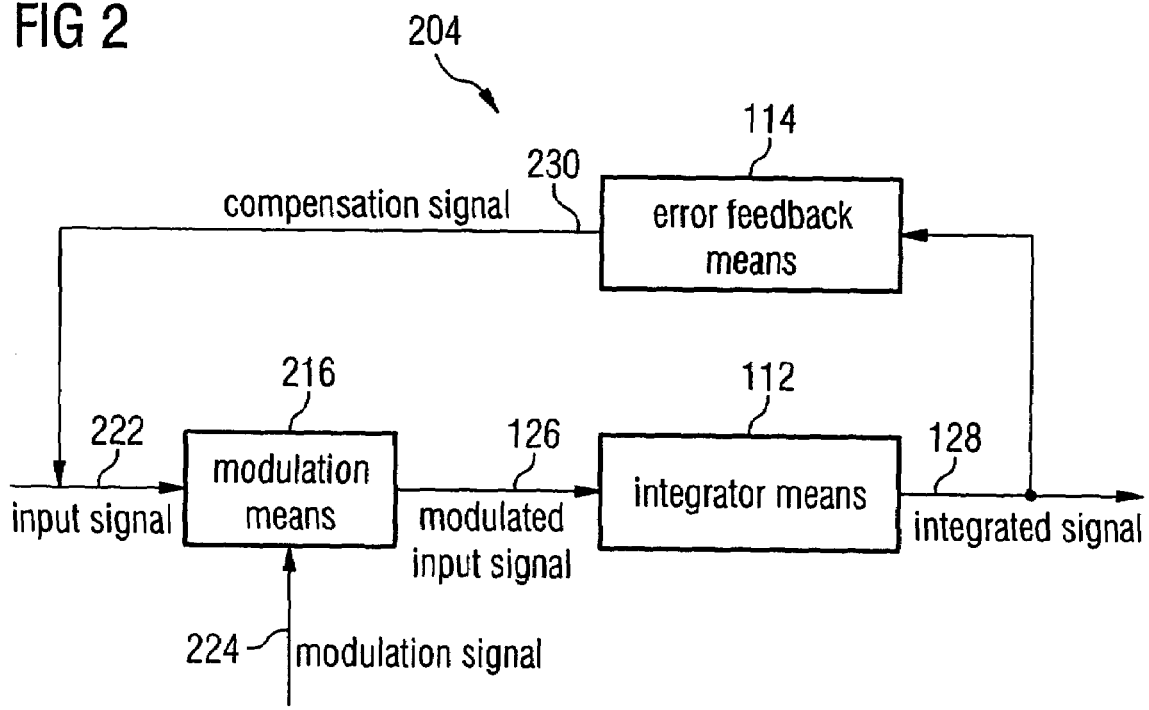

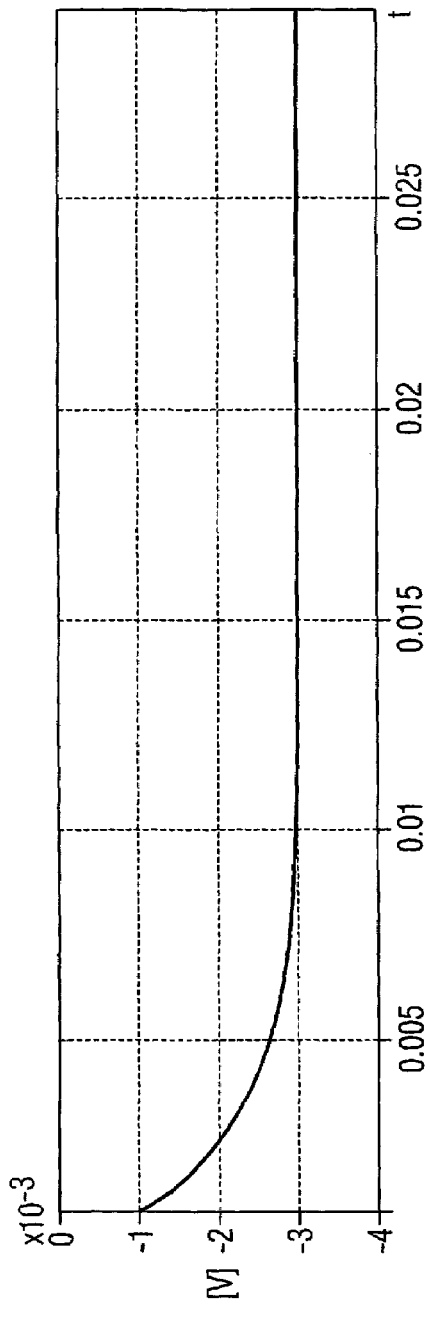
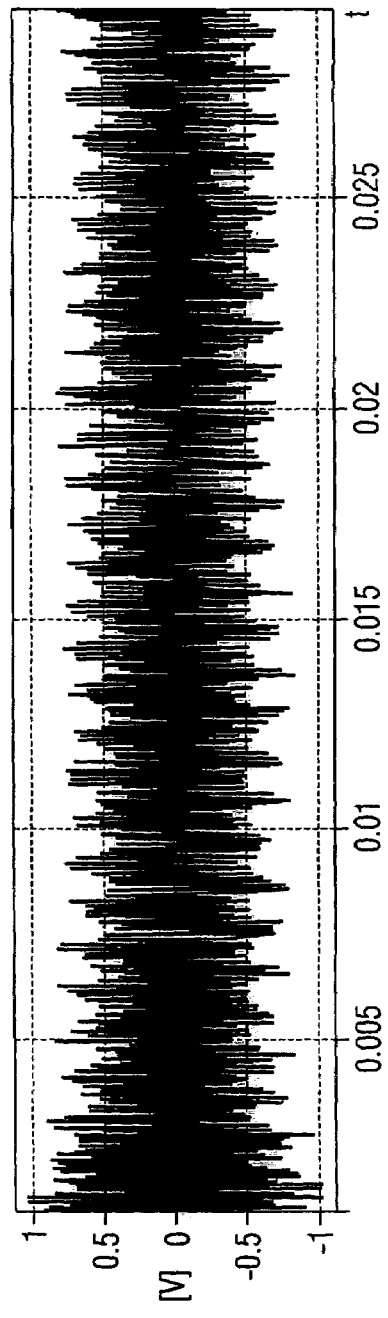
FIG 5A
FIG 5B

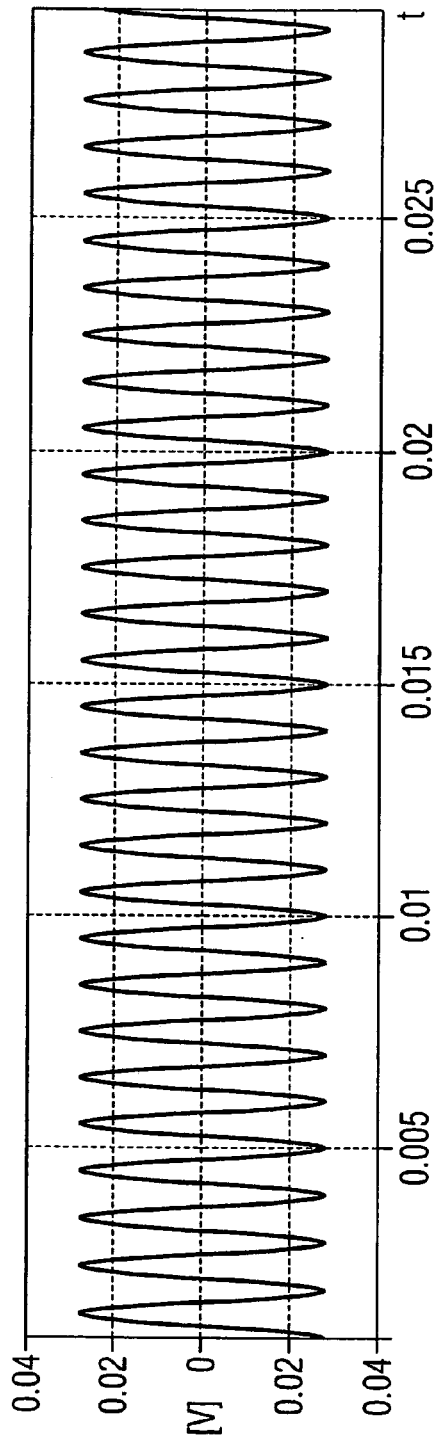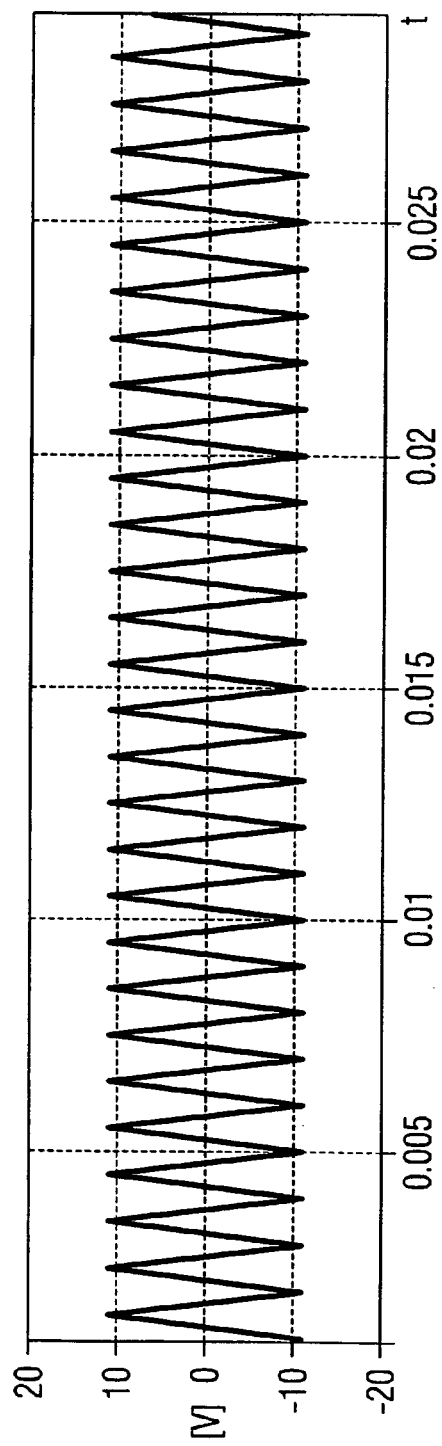

INTEGRATOR CIRCUIT

CROSS-REFERENCE TO RELATED APPLICATION

This application claims priority from German Patent Application No. 10 2004 022 572.9, which was filed on May 07, 2004, and is incorporated herein by reference in its entirety.

TECHNICAL FIELD

The present invention refers to integrator circuits and integration methods, as may in particular be employed in analog-to-digital converters and sensors based on integrator circuits.

BACKGROUND

Analog-to-digital converters which are based on a sigma delta architecture are in particular employed in measuring technology. Sigma delta analog-to-digital converters comprise one or a plurality of integrator stages. A digital output value of the analog-to-digital converter is often corrupted by an offset error. The offset error can usually be attributed to an offset error already contained in the analog input signal on the one hand and to an offset error generated in the analog-to-digital converter on the other hand.

One way of eliminating an offset error in the analog input signal is introduced in the data sheet HAL 805 by the company Micronas. The HAL 805 is a magnetic field sensor comprising a Hall plate having chopped offset compensation and an analog-to-digital converter. The offset compensation is based on chopping the first integrator stage with a full offset signal. Disadvantageous demodulation effects and alias effects, however, are formed here and the signal-to-noise ratio deteriorates. Additionally, the area requirement of the analog-to-digital converter increases due to a first very large integrator stage required. In chopping, the signal to be chopped is usually to be modulated by a square-wave signal. The result is an offset error appearing, on average, as a square-wave signal.

WO 0203087 A1 refers to a pre-amplifier having error feedback. The solution suggested, however, is of advantage in that an analog signal can only be subjected to an analog-to-digital conversion downstream of the pre-amplifier described and after a subsequent demodulation. Additionally, the pre-amplifier circuit increases the area requirements and the current consumption. Another disadvantage is the delay time caused by the pre-amplifier having error feedback.

IEEE Journal of Solid-State Circuits, Vol. 31, MO. Dec. 12 1996, "A 0.2-mW CMOS Sigma-Delta Modulator for Speech Coding with 80 dB Dynamic Range", by Eric J. van der Zwan and E. Carel Dijkmans, mentions demodulation effects (alias) in chopped input integrators. A considerable disadvantage, however, is the fact that offset errors of the input transistors are not eliminated.

SUMMARY

It is an object of the present invention to provide an integrator circuit and an integration method enabling safe signal processing.

In accordance with a first aspect, the present invention provides an integrator circuit having: integrator means, the integrator means being formed to produce an integrated signal from a modulated input signal; and error feedback means connected to an output of the integrator means and to an input of the integrator means, the error feedback means being formed to determine an error component from the integrated signal or from a signal derived from the integrated signal and to compensate the error component via the feedback in the modulated input signal.

In accordance with a second aspect, the present invention provides an analog-to-digital converter having: an above mentioned integrator circuit formed to receive an analog input signal; a comparator formed to compare the integrated signal or a signal derived from the integrated signal to a threshold value; and a digital-to-analog converter, the digital-to-analog converter being formed to determine a digital value responsive to a first comparison result of the comparator and to feed back an analog signal corresponding to the digital value into the integrator circuit, wherein the digital-to-analog converter is further formed to provide the digital value responsive to a second comparison value of the comparator, the digital value corresponding to the analog input signal.

In accordance with a third aspect, the present invention provides a sensor having: measuring means for detecting a measuring quantity, the measuring means being formed to provide a measurement signal corresponding to the measuring quantity; measuring modulation means formed to modulate the measurement signal by a chopper clock; and an above mentioned analog-to-digital converter for performing an analog-to-digital conversion of the measurement signal modulated by the chopper clock.

In accordance with a fourth aspect, the present invention provides an integration method having the steps of: integrating a modulated input signal to generate an integrated signal; and determining an error component from the integrated signal or from a signal derived from the integrated signal and feeding back the error component to the modulated input signal to compensate the error component.

The present invention is based on the finding that feeding back an error component, such as, for example, an offset error of an integrator circuit, to the input of the integrator circuit allows an advantageous compensation of the error component.

The inventive approach is of advantage in that demodulation effects or alias effects in chopped integrators can be reduced considerably. In analog-to-digital converters the first integrator stage of which is based on the inventive integrator circuit, there is no offset square-wave signal in the first integrator stage. Thus, an offset-free sigma delta analog-to-digital converter can be realized. In particular, there are no demodulation effects or square distortions due to a remaining offset at the input of the first integrator. Additionally, no pre-amplification by a pre-amplifier or demodulation is required in the inventive approach to be able to perform an analog-to-digital conversion subsequently. In the solution suggested, the first integrator is chopped. Thus, the area and the current consumption of the pre-amplifier are saved.

The inventive approach allows achieving a very small offset error or a zero point error in a sigma delta analog-to-digital converter, in particular in continuous-time sigma delta ADCs for sensor signal detection.

The suggestion also solves a well-known problem in telecommunication applications. A direct conversion of high-frequency signals is possible without offset when the output chopper switch is omitted or when an odd number of chopper switches are contained in the signal chain to the output. A sigma delta analog-to-digital converter based on the inventive integrator circuit can thus be applied advantageously for baseband applications in telecommunications.

BRIEF DESCRIPTION OF THE DRAWINGS

Embodiments of the present invention will be detailed subsequently referring to the appended drawings, in which:

FIG. 1 is a block circuit diagram of an integrator circuit according to the present invention;

FIG. 2 is a block circuit diagram of an integrator circuit according to another embodiment of the present invention;

FIGS. 5A show wave-forms of the integrator circuit shown to 5D in FIG. 3;

DETAILED DESCRIPTION

Figure 3:
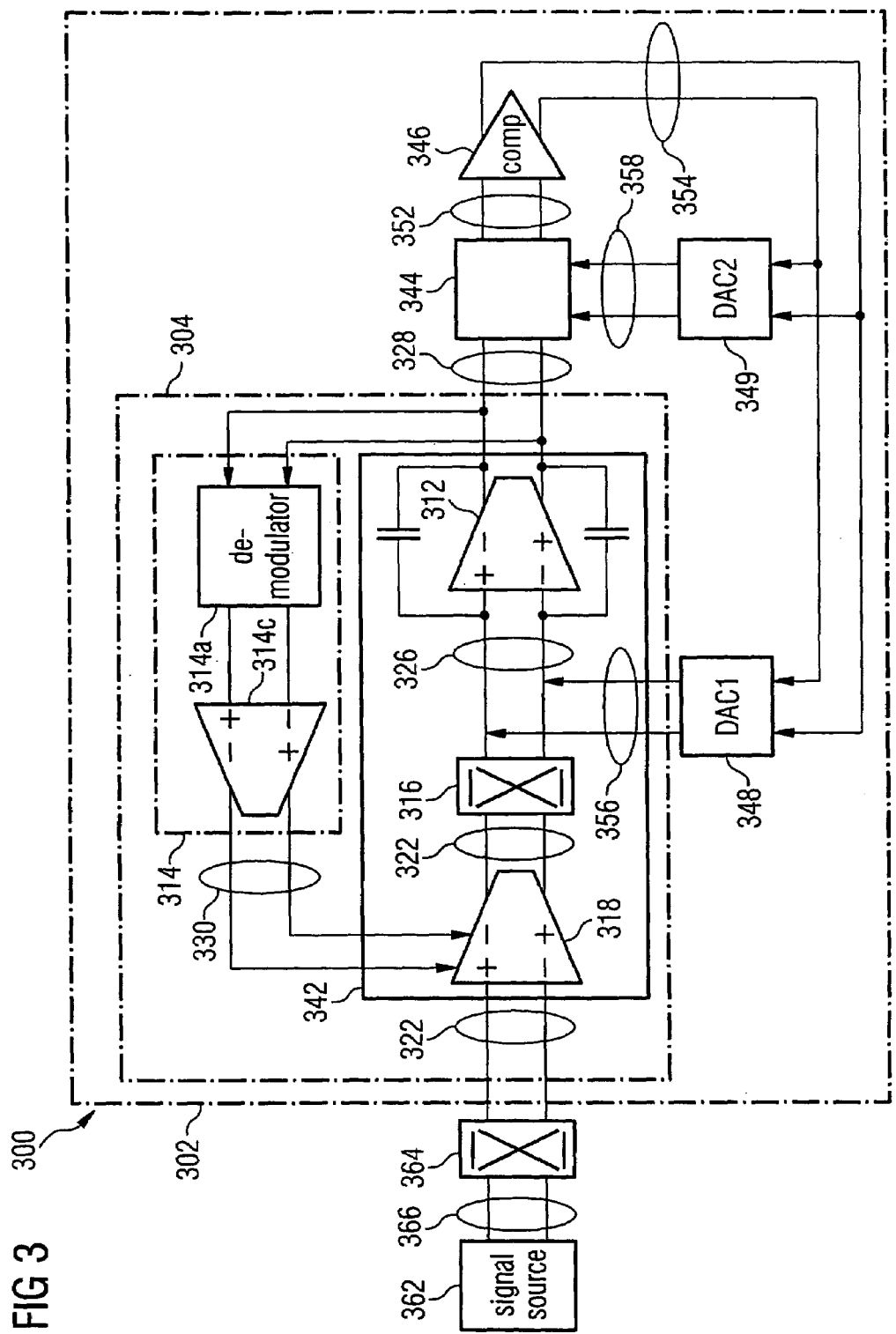
FIG. 3 is a block circuit diagram of a sensor having an analog-to-digital converter based on an integrator circuit according to the present invention.

Similar or same reference numerals will be used in the subsequent description of the preferred embodiments of the present invention for elements illustrated in the different drawings and having similar effects, wherein a duplicate description of these elements will be omitted.

FIG. 1 shows a schematic illustration of an integrator circuit 104 according to an embodiment of the present invention. The integrator circuit 104 comprises integrator means 112 and error feedback means 114. The integrator means 112 is formed to receive a modulated input signal 126, to integrate the modulated input signal 126 and output same as an integrated signal 128. The error feedback means 114 is formed to determine an error component 130 of the integrated signal 128. For this, the error feedback means 114 is connected to the integrated signal 128. The error feedback means 114 is also formed to negatively feed back the error component 130 determined into the modulated input signal 126.

Preferably, the modulated input signal 126 is a chopped signal, i.e. a signal modulated by a square-wave signal. The error component 130 of the integrated signal 128 refers to a zero point shift or offset of the integrated signal 128. The offset typically has two error causes. On the one hand, the modulated input signal 126 may already contain an offset error. This offset error is integrated by the integrator means 112 and passed on to the integrated signal 128. Furthermore, the integrator means 112 itself may cause an offset error of the integrated signal 128, such as, for example, due to a tuning error. The offset error causes a signal information corruption of the integrated signal 128. The error feedback means 114 is formed to detect this offset error of the integrated signal 128 and compensate same at an input of the integrator means 112. The error feedback means 114 thus represents a feedback branch between an output of the integrator means 112 and an input of the integrator means 112.

The error feedback means 114 will be described in greater detail referring to FIGS. 4 and 5.

FIG. 2 shows a block circuit diagram of another embodiment of an integrator circuit 204 according to the present invention. The integrator circuit 204, in addition to the integrator circuit shown in FIG. 1, comprises modulation means 216. The modulation means is formed to receive an input signal 222 and a modulation signal 224. The modulation means 216 is formed to modulate the input signal 222 by the modulation signal 224 and to output the modulated input signal 126. In this embodiment, the error component of the integrated signal 128 determined by the error feedback means 114 is fed back or negatively fed back as a compensation signal 130 to the input signal 222 to already compensate the portion of the error component in the input signal 222.

Typically, the modulation means 216 comprises a chopper switch and the modulation signal 224 provides a chopper clock. In order to generate the compensation signal 230, the error feedback means 114 is typically formed to demodulate the integrated signal 128 by the chopper clock of the modulation signal 224.

In this embodiment, the input signal 222 is a non-modulated signal. Alternatively, the input signal 222 may also be a modulated signal. In this case, the input signal 222 is preferably modulated by another modulation signal synchronous to the modulation signal 224. In this way, an offset error of the modulated input signal 222 may also be compensated by the error feedback means 114.

FIG. 3 shows a block circuit diagram of a sensor 300 according to the present invention. The sensor 300 comprises an analog-to-digital converter 302 according to the present invention. The analog-to-digital converter in turn is based on an integrator circuit 304 according to the present invention. The circuits described in FIG. 3 operate with differential signals. This means that the signals mentioned in FIG. 3 are a respective signal pair.

The integrator circuit 304 comprises an integrator 312, error feedback means 314, modulation means in the form of a chopper switch 316 and a negative feedback element 318. The negative feedback element 318 receives an analog input signal 322 and is connected to the chopper switch 316 via an input signal 323. The chopper switch 316 is connected to the integrator 312 outputting an integrated signal 328 via a modulated input signal 326. The error feedback means 314 is connected to the integrated signal 328 on the input side and connected to the negative feedback element 318 via a compensation signal 330 on the output side.

In this embodiment, the integrator 312 is an operational amplifier, the outputs of which are fed back to the respective inputs via capacities. The integrator 312 is formed to receive and integrate the modulated input signal 326 and to output same as an integrated signal 328. The integrated signal 328 in turn, due to offset errors, comprises an error component determined by the error feedback means 314 and negatively fed back into the analog input signal 322 via the negative feedback element 318 to compensate the error component at the integrator 312 on the input side. The error feedback means comprises an amplifier 314c and a demodulator 314a and the demodulator 314a is formed to receive the integrated signal 328. The demodulator is formed to demodulate the offset component of the integrated signal 328. Subsequently, the offset component is amplified in the amplifier 314c to generate the compensation signal 330. The amplifier 314c may also be formed as an attenuator or a voltage-controlled current source. The negative feedback element 318 in this embodiment is an amplifier performing an offset compensation to the analog input signal 322. The offset compensation by the negative feedback element 318 is controlled by the compensation signal 330. The chopper switch 316 is formed to chop the input signal 322 by a first chopper clock usually fed to the chopper switch 316 via a modulation signal (not shown in FIG. 3). This chopper clock is usually also fed to the demodulator 314a and the demodulator 314a demodulates the integrated signal 328 by the chopper clock.

In this embodiment, the integrator circuit 304 comprises a first integrator stage 342 of the analog-to-digital converter 302. The analog-to-digital converter 302 additionally comprises a second integrator stage 344, a comparator 346 and a first digital-to-analog converter 348 and a second digital-to-analog converter 349. The first integrator stage 342 is connected to the second integrator stage 344 via the integrated signal 328. The second integrator stage 344 provides a second integrated signal 352 to the comparator 346. The comparator 346 is formed to output a comparison signal 354 to the first digital-to-analog converter 348 and the second digital-to-analog converter 349. The first digital-to-analog converter 348 is formed to provide a first feedback signal 356 to the first integrator stage 342. In this embodiment, the first feedback signal 356 is coupled into the modulated input signal 326 of the first integrator stage 342. The second digital-to-analog converter 349 is formed to provide a second feedback signal 358 to the second integrator stage 344.

The analog-to-digital converter 302 shown in FIG. 3 is a sigma delta analog-to-digital converter converting an analog input signal 322 to a digital value. The digital value is generated in the digital-to-analog converters 348, 349. The analog-to-digital converters 348, 349 comprise additional logic (not shown in the figures) for determining the digital value. The comparator 346 is formed to compare the second integrated signal 352 to a predetermined threshold value. The result of the comparison is communicated to the digital-to-analog converters 348, 349 via the comparison signal 354. With a mismatch, a stored digital value is changed and subjected to a digital-to-analog conversion in the digital-to-analog converters 348, 349 and coupled into the integrator stages 342, 344. If the digital value stored in the digital-to-analog converters 348, 349 corresponds to the analog input signal 322, the comparator 346 will communicate this match to the digital-to-analog converters 348, 349 via the comparison signal 354. In this case the digital value stored in the digital-to-analog converters 348, 349 will not be changed but be output and stored, respectively, as a digital output value corresponding to the analog input signal 322. Due to the error feedback in the first integrator stage 342, the digital result value is corrected by an offset error component of the integrated signal 328.

In the embodiment shown in FIG. 3, the analog input signal 322 is a modulated analog measurement signal provided by measuring means 362 and second modulation means 364 in the form of a chopper switch. The measuring means is formed to detect a measuring quantity and to output the measurement signal 366 corresponding to the measuring quantity detected. The measurement signal 366 is chopped by the chopper switch 364.

According to the present invention, an offset feedback loop is inserted into the first integrator stage of a sigma delta ADC in parallel to actual signal feedback loops including comparators and DACs.

The first integrator stage integrates its own offset in connection with the feedback and, if required, that of the measuring means, in this case a Hall plate, to zero when chopped.

The offset signal of the first integrator and, if required, of the chopped Hall plate is, as is the case in present sigma delta ADCs, simply subjected to an integration, then demodulated by the chopper clock and negatively fed back in the usual feedback loops.

An offset signal in the input stage of the first integrator appears, on average, at the output of the first integrator as a square-wave signal superimposed by the usual high-frequency signals of a sigma delta converter.

This square-wave signal can then be demodulated by the chopper clock (Ph1 and Ph2), taking the phase into consideration, and may before be subjected to low-pass filtering. Subsequently, the offset signal demodulated in this way is, for example, integrated by an operational amplifier OTA and integration C and subsequently, for example, subjected to a voltage-to-current conversion by an OTA.

The current obtained in this way is negatively fed back into the first integrator stage, whereupon the offset in the first integrator stage eliminates itself after some chopper clocks with suitable dimensioning.

Figure 4:
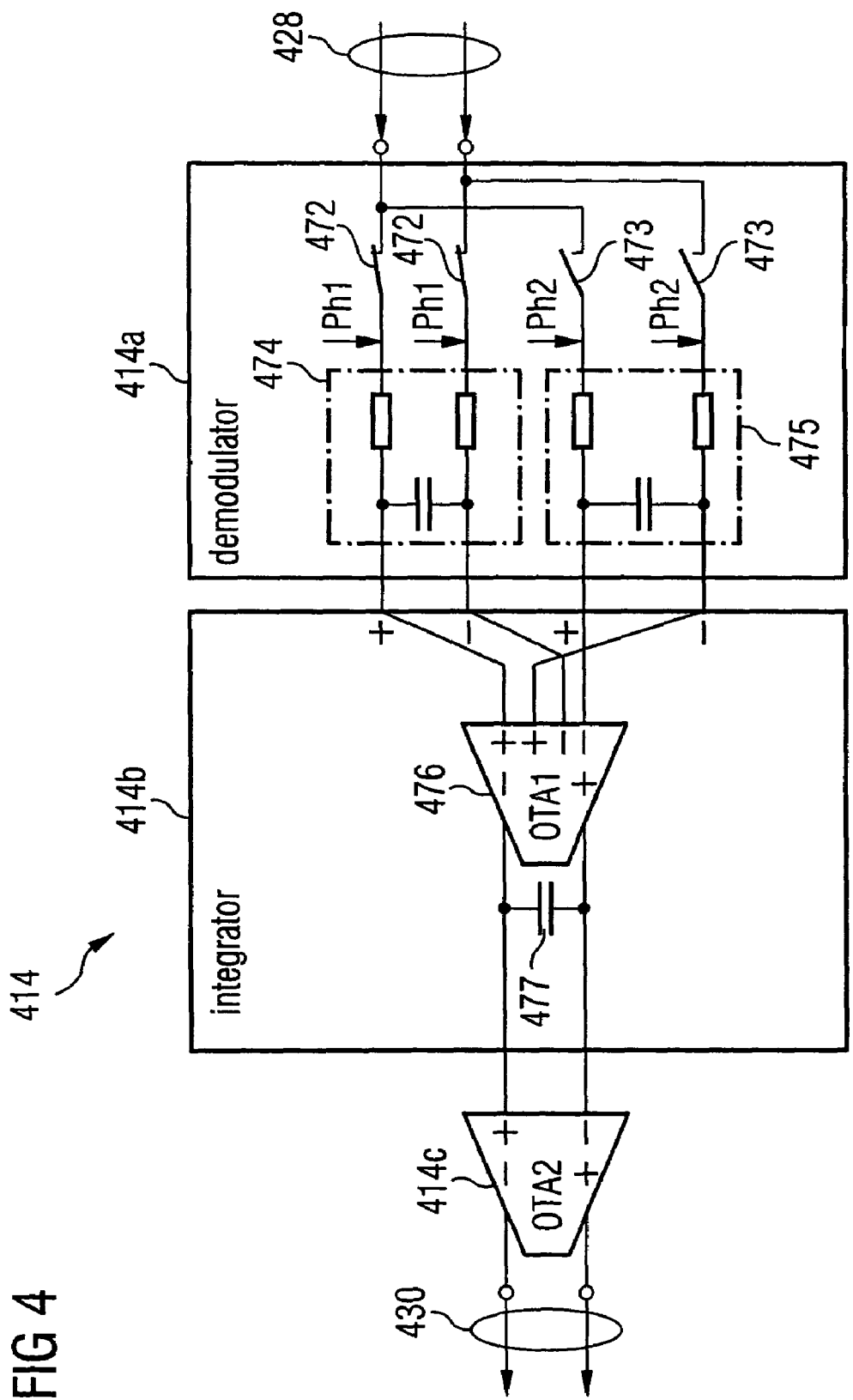
FIG. 4 is a detailed schematic illustration of error feedback means according to the present invention.

FIG. 4 shows a detailed block circuit diagram of an error feedback means 414, as may be employed for the error feedback means shown in FIGS. 1 to 3.

The error feedback means 414 comprises a demodulator 414a, an integrator 414b and a voltage-to-current converter 414c. The error feedback means 414 is formed to receive an integrated signal 428 and to output a compensation signal 430. The error feedback means 414 in turn is formed in differential signal technology. The integrated signal 428 thus is a differential input and the compensation signal 430 is a differential output.

The demodulator 414a comprises first demodulator switches 472, second demodulator switches 473, a first low pass 474 and a second low pass 475. The demodulator switches 472, 473 demodulate the integrated signal 428. The demodulator 414a effects periodic switching, in the modulation clock, to the first low-pass filter 474 and the second low-pass filter 475. Both low-pass filters 474, 475 comprise an RC element. The outputs of the low-pass filters 474, 475 are cross-connected to the integrator 414b. The low-pass filters 474, 475 effect coupling out of the offset error component from the integrated signal 428. This error component is amplified in the integrator 414b.

The integrator 414b in this embodiment is realized by an operational amplifier 476 referred to as OTA1, the outputs of which are connected via a capacity 477. The integrator 414b effects integration of the offset components extracted from the integrated signal 428.

The voltage-to-current converter 414c taps an offset voltage at the capacity 477 and converts this offset voltage into an output current corresponding to the offset voltage, which is output as a compensation signal 430. Thus, a compensation current corresponding to the offset component of the integrated signal 428 is provided via the compensation signal 430.

FIGS. 5A to 5D show wave-forms of some of the signals described in FIGS. 3 and 4.

FIG. 5A shows a settling of the offset integrator output so that an offset of 3 millivolt is negatively fed back. The characteristic curve of the offset voltage shown in FIG. 4 corresponds to the offset voltage at the capacitor 477.

FIG. 5B shows a voltage course of the integration signals 328, 428 shown in FIGS. 3 and 4. It can be seen from the wave form shown in FIG. 5B that the offset compensation compensates an offset still present in the first clock cycles already after a few clock cycles.

FIG. 5C shows the analog input signal 322 shown in FIG. 3, representing a measurement signal of the measuring means 362. The wave-form in the form of a sine may represent a voltage or even a magnetic field strength. The analog input signal shown in FIG. 5C is converted into a digital output signal by the analog-to-digital converter 302 shown in FIG. 3.

FIG. 5d shows an output signal of the sigma delta converter shown in FIG. 3 in the form of a digital code, which has been established from the analog input signal shown in FIG. 5C.

Figure 6:
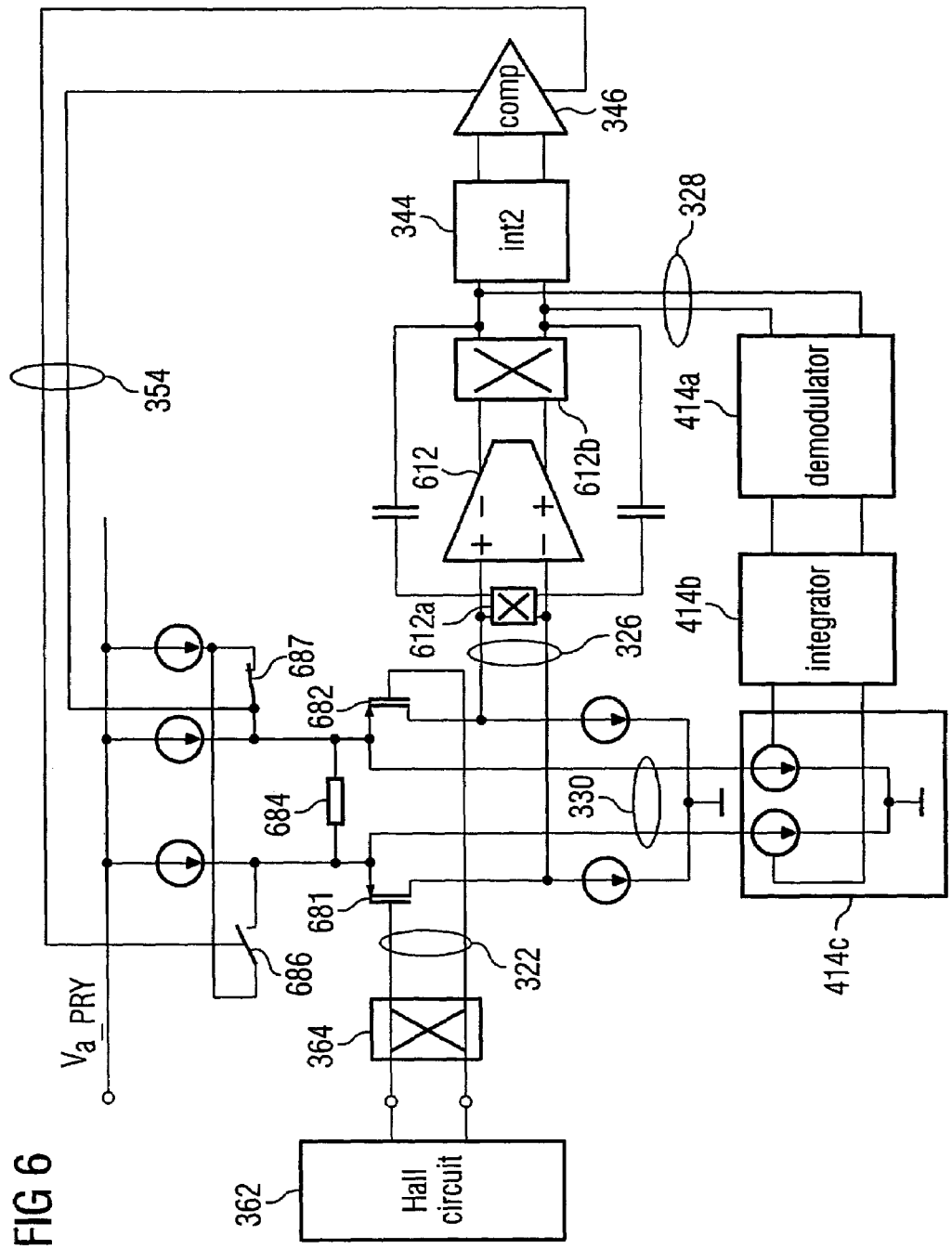
FIG. 6 shows another embodiment of a sensor having an analog-to-digital converter based on an integrator circuit according to the present invention.

FIG. 6 shows a block circuit diagram of another embodiment of a sensor. Elements which have already been described referring to FIGS. 3 or 4 are provided with the same reference numerals and will not be described again.

In this embodiment, a first integrator stage includes integrator means 612 comprising an operational amplifier and two feedback capacitors, and modulation means 611b at the output of the integrator means 612. The feedback capacities of the integrator means 612 connect the outputs of the modulation means 611b to the inputs of the operational amplifier of the integrator circuit 612 via another modulation means 612a.

The error feedback means, according to FIG. 4, includes a demodulator 414a, an integrator 414b and a voltage-to-current converter 414c which in this embodiment comprises two controlled current sources. Coupling of the compensation signal 330 into the analog input signal 322 in this embodiment takes place via a P channel MOS differential pair 681, 682. The differential analog input signal 322 controls the gate terminals of the MOS transistors 681, 682. The source terminals of the transistors 681, 682 are connected to each other via a degeneration resistor 684. The first amplifier (OTA) of the first integrator stage is in this embodiment formed by the P channel MOS differential pair 681, 682 and the source degeneration resistor 684. The offset negative feedback is formed by the unchopped regulated currents of the compensation signal 330 controlled by the offset integrator 414b and generating a compensation voltage via the source degeneration resistor 684. Instead of the digital-to-analog converter shown in FIG. 3, the comparator 346 in this embodiment controls a first switch 686 and a second switch 687 via the comparison signal 354. The source terminals of the transistors 681, 682 are connected to a voltage supply line $V_{Supply}$. The supply voltage in this embodiment is chopped.

FIG. 6 shows an embodiment having fully differential gm-C technology. This means that the first amplifier (OTA) of the first integrator stage having capacities (Cs) corresponds to a transconductance amplifier having integration capacities.

Figure 7:
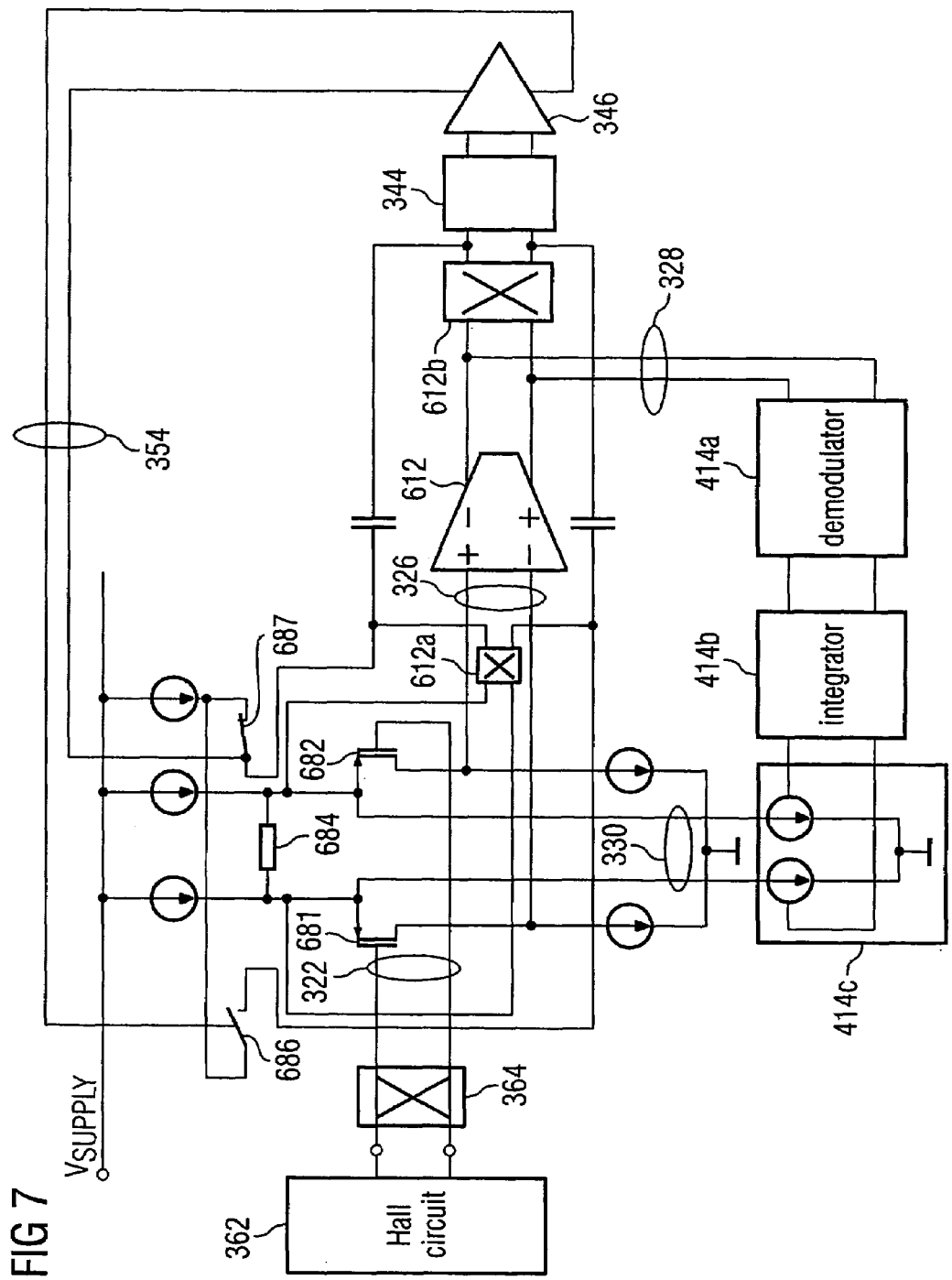
FIG. 7 shows another embodiment of a sensor having an analog-to-digital converter based on an integrator circuit according to the present invention.

FIG. 7 shows a block circuit diagram of another embodiment of a sensor. The elements shown in FIG. 7 correspond to the elements of the embodiment described in FIG. 6 and will not be described again. In contrast to the embodiment shown in FIG. 6, the integrated signal 328, in the embodiment shown in FIG. 7, is tapped at the input of the modulation means 612b and fed to the demodulator 414a. Furthermore, the inputs of the modulation means 612a are not connected to the modulated input signal 326 but connected at both sides to the degeneration resistor 684. The outputs of the modulation means 612a in turn are connected to the feedback capacities of the integrator means 612. In addition, the switches 686, 687 are not connected to the source terminals of the transistors 681, 682 at the output side but are also connected to the feedback capacities of the integrator means 612.

In contrast to the embodiment shown in FIG. 6, the integration capacities are connected to the "sensing resistor" or sources of the first transconductance stage. Thus, the negative feedback element 318 described in FIG. 3 is to some extent mixed with the integrator 312.

In the embodiments shown, offset error feedback takes place to an integrator state which may be a first integrator stage of a sigma delta converter. The feedback thus takes place from the output of the first integrator stage. It is also possible to derive an offset feedback from a second or another stage of a sigma delta converter. This has the advantage that offset errors of the second or another integrator stage are also compensated.

In order to be able to also eliminate an offset error of the measuring means in a sensor, the measurement signal is preferably chopped by the same clock or a synchronously divided or multiple clock also used for clocking the chopper switch in the first integrator stage. If the measuring means is a Hall plate, the Hall plate will be switched by 90° by the same clock or a synchronously divided or multiple clock, corresponding to the clock of the first integrator stage, so that the offset errors thereof are eliminated at the same time.

According to another embodiment, the inventive approach is for example employed for a sigma delta ADC for baseband applications in telecommunications. A direct conversion of high-frequency signals is possible here without offset when an output chopper switch is omitted or when an odd number of chopper switches is contained in the signal chain to the output.

According to another embodiment, the compensation signal is not current-controlled but voltage-controlled. This means that a voltage is negatively fed back into the input signal of the integrator. The negative feedback may also take place here via resistors or switched capacities. In addition, the negative feedback may also take place at the outputs of the first amplifier (OTA) of the first integrator stage. The demodulation in the error feedback means may also take place via simple low-pass filters and the offset integrator may be a low pass.

Furthermore, a continuous-time technique or switched-OPAmp technique instead of a switched-capacitor technique is possible for the error feedback means. These techniques may also be employed in the integrator. In particular, the inventive approach may be employed in connection with chopped Hall plates or a "spinning Hall plate".

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An integrator circuit comprising:
   an integrator unit having an input and an output, said unit generating an integrated signal from a modulated input signal; and
   an error feedback coupler connected to the output of the integrator unit and to the input of the integrator unit, the error feedback coupler determining an error component from the integrated signal or from a signal derived from the integrated signal, and compensates the error component via the feedback in the modulated input signal;
   wherein the error feedback coupler comprises a demodulator, and wherein the demodulator is formed to extract the error component of the integrated signal, and wherein the error feedback coupler additionally comprises an intergrator formed to amplify the error component.

2. An integrator circuit according to claim 1, further comprising a modulator to generate the modulated input signal from an input signal and a modulation signal, wherein the error feedback coupler provides a compensation signal corresponding to the error component and couple same into the input signal.

3. An integrator circuit according to claim 1, wherein the modulator comprises a chopper switch, said chopper switch modulates the input signal by a square-wave signal.

4. An integrator circuit according to claim 1, wherein the error feedback coupler determines an offset error of the integrated signal and to negatively feed back the offset error into the input signal.

5. An integrator circuit according to claim 1, wherein the error feedback coupler further comprises a voltage-to-current converter to convert the amplified error component into a current-controlled compensation signal.

6. An integrator circuit according to claim 1, wherein the demodulator further comprises a low-pass unit to extract the error component from the integrated signal.

7. An integrator circuit according to claim 1, wherein the demodulator demodulates the integrated signal by the chopper clock.

8. An integrator circuit according to claim 1, further comprising an input stage to couple the compensation signal into the input signal.

9. An integrator circuit according to claim 8, wherein the input stage comprises a P channel MOS differential pair and a source degeneration resistor, and the compensation signal generates a compensation voltage in a source degeneration resistor.

10. An integrator circuit according to claim 1, wherein the error feedback coupler couples the compensation signal into the input signal as a compensation voltage.

11. An integrator circuit according to claim 8, wherein the input stage comprises a compensation resistor to negatively feed back the error component into the input signal controlled by the compensation signal.

12. An integrator circuit according to claim 8, wherein the input stage comprises a switch capacity to negatively feed back the error component into the input signal controlled by the compensation signal.

13. An integrator circuit according to claim 1, wherein the demodulator is a low-pass filter.

14. An integrator circuit according to claim 1, wherein the integrator is a low pass filter.

15. An integrator circuit according to claim 8, wherein the input stage receives a high-frequency signal.

16. An integrator circuit according to claim 1, further comprising a second integrator downstream of the integrator unit, wherein the signal derived from the integrated signal is an output signal of the second integrator.

17. An integrator circuit according to claim 2, wherein the input signal is a signal modulated by a first modulation clock, and the modulator modulates the input signal by a second clock synchronous to the first modulation clock.

18. An analog-to-digital converter device comprising:
an integrator circuit to receive an analog input signal, said circuit comprising an integrator and an error feedback coupler, the integrator generating an integrated signal from a modulated input signal, the integrator having an input and an output; the error feedback coupler connected to the output of the integrator and to the input of the integrator, the error feedback coupler determining an error component from the integrated signal or from a signal derived from the integrated signal and compensates the error component via feedback in the modulated input signal, wherein the error feedback coupler comprises a demodulator, and wherein the demodulator is formed to extract the error component of the integrated signal, and wherein the error feedback coupler additionally comprises an integrator formed to amplify the error component;
a comparator to compare the integrated signal or a signal derived from the integrated signal to a threshold value; and
a digital-to-analog converter determining a digital value responsive to a first comparison result of the comparator and to feed back an analog signal corresponding to the digital value into the integrator circuit, the digital-to-analog converter provides the digital value responsive to a second comparison value of the comparator, wherein the digital value corresponds to the analog input signal.

19. An analog-to-digital converter according to claim 18, further comprising a second integrator stage to integrate the integrated signal and to provide same to the comparator as a signal derived from the integrated signal.

20. A sensor comprising:
a measurer for detecting a measurement quantity to provide a measurement signal corresponding to the measurement quantity;
a measurement modulator to modulate the measurement signal by a chopper clock; and
an analog-to-digital converter comprising an integrator circuit to receive an analog input signal, said circuit comprising an integrator unit to generate an integrated signal from a modulated input signal, and an error feedback coupler connected to an output of the integrator unit and to an input of the integrator unit, the error feedback coupler determining an error component from the integrated signal or from a signal derived from the integrated signal and compensates the error component via the feedback in the modulated input signal, wherein the error feedback coupler comprises a demodulator, and wherein the demodulator is formed to extract the error component of the integrated signal, and wherein the error feedback coupler additionally comprises an integrator formed to amplify the error component; a comparator to compare the integrated signal or a signal derived from the integrated signal to a threshold value; and a digital-to-analog converter, the digital-to-analog converter determining a digital value responsive to a first comparison result of the comparator and to feed back an analog signal corresponding to the digital value into the integrator circuit, wherein the digital-to-analog converter provides a digital value responsive to a second comparison value of the comparator, the digital value corresponding to the analog input signal, the analog-to-digital converter performing an analog-to-digital conversion of the measurement signal modulated by the chopper clock.

21. An sensor according to claim 19, wherein the measurer is a Hall plate.

22. An integration method comprising:
integrating a modulated input signal to generate an integrated input signal;
determining an error component from the integrated signal or from a signal derived from the integrated signal and feeding back the error component into the modulated input signal to compensate the error component;

extracting the error component of the integrated signal by demodulating the integrated signal, and amplifying the error component by integrating the error component.

23. An integrator circuit comprising:
an integrator unit, the integrator unit being formed to generate an integrated signal from a modulated input signal,
an error feedback coupler connected to an output of the integrator unit and to an input of the integrator unit, the error feedback coupler being formed to determine an error component from the integrated signal or from a signal derived from the integrated signal and to compensate the error component via a feedback in the modulated input signal, wherein the error feedback coupler comprises a demodulator, and wherein the demodulator is formed to extract the error component of the integrated signal, and wherein the demodulator further comprises a low-pass unit the low-pass unit is formed to extract the error component from the integrated signal.

24. An integrator circuit according to claim 23, wherein the demodulator is a low-pass filter.

25. An integrator circuit comprising:
an integrator unit, the integrator unit being formed to generate an integrated signal from a modulated input signal,
an error feedback coupler connected to an output of the integrator unit and to an input of the integrator unit, the error feedback coupler being formed to determine an error component from the integrated signal or from a signal derived from the integrated signal and to compensate the error component via a feedback in the modulated input signal, and
a modulator, the modulator being formed to generate the modulated input signal from an input signal and a modulation signal, and wherein the error feedback coupler is formed to provide a compensation signal corresponding to the error component and couple the compensation signal into the input signal;

wherein the modulator comprises a chopper switch, and wherein the chopper switch is formed to modulate the input signal by a chopper clock;

wherein the error feedback coupler comprises a demodulator, and wherein the demodulator is formed to demodulate the integrated signal by the chopper clock.

26. An integrator circuit comprising:
an integrator unit, the integrator unit being formed to generate an integrated signal from a modulated input signal,
an error feedback coupler connected to an output of the integrator unit and to an input of the integrator unit, the error feedback coupler being formed to determine an error component from the integrated signal or from a signal derived from the integrated signal and to compensate the error component via a feedback in the modulated input signal, and
a modulator, the modulator being formed to generate the modulated input signal from an input signal and a modulation signal, and
wherein the error feedback coupler is formed to provide a compensation signal corresponding to the error component and couple the compensation signal into the input signal; and
an input stage formed to couple the compensation signal into the input signal, wherein the input stage comprises a P channel MOS differential pair and a source degeneration resistor, and wherein the compensation signal is formed to generate a compensation voltage in the source degeneration resistor.

* * * * *

UNITED STATES PATENT AND TRADEMARK OFFICE
CERTIFICATE OF CORRECTION

| | |
|---|---|
| PATENT NO. | : 7,098,827 B2 |
| APPLICATION NO. | : 11/124436 |
| DATED | : August 29, 2006 |
| INVENTOR(S) | : Mario Motz |

It is certified that error appears in the above-identified patent and that said Letters Patent is hereby corrected as shown below:

Title page, item [30] Please correct the Foreign Application Priority Data by deleting "10 2004 002 572" and replace with --"10 2004 022 572"--.

Signed and Sealed this

Nineteenth Day of December, 2006

JON W. DUDAS
*Director of the United States Patent and Trademark Office*